(12) United States Patent
Wilhite

(10) Patent No.: US 8,121,215 B2
(45) Date of Patent: Feb. 21, 2012

(54) BROADBAND SELF ADJUSTING QUADRATURE SIGNAL GENERATOR AND METHOD THEREOF

(75) Inventor: Jeffrey B. Wilhite, Barrington, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 1218 days.

(21) Appl. No.: 11/771,005

(22) Filed: Jun. 29, 2007

(65) Prior Publication Data

US 2009/0003482 A1    Jan. 1, 2009

(51) Int. Cl.
*H04L 25/49* (2006.01)

(52) U.S. Cl. ........ 375/296; 375/254; 332/107; 332/159; 332/162; 455/501; 455/63.1; 455/114.2

(58) Field of Classification Search .......... 375/296, 375/254; 332/107, 159, 162; 455/501, 63.1, 455/114.2
See application file for complete search history.

(56) References Cited

U.S. PATENT DOCUMENTS

| 5,375,258 | A |   | 12/1994 | Gillig |
| 5,399,995 | A | * | 3/1995  | Kardontchik et al. ........... 331/17 |
| 6,078,200 | A | * | 6/2000  | Miyano .......................... 327/142 |
| 6,253,066 | B1| * | 6/2001  | Wilhite et al. ................ 455/108 |
| 2003/0048500 | A1| * | 3/2003 | Fala et al. ..................... 359/110 |

* cited by examiner

*Primary Examiner* — Chieh M Fan
*Assistant Examiner* — Leila Malek
(74) *Attorney, Agent, or Firm* — Terri Hughes Smith; Valerie M. Davis

(57) ABSTRACT

Low noise phase quadrature signals are generated after receiving a clock signal and adjusting the clock signal in response to a feedback signal to generate a phase adjusted clock signal. The clock signal and the phase adjusted clock signal are exclusive-ored to generate a frequency doubled signal. An in-phase local oscillator signal and a quadrature local oscillator signal are generated from the frequency doubled signal such that the in-phase local oscillator and the quadrature local oscillator signal are out-of-phase with each other. In addition, a phase relationship between the in-phase local oscillator signal and the quadrature local oscillator signal are detected, and the feedback signal is generated based upon the phase relationship between the in-phase local oscillator signal and the quadrature local oscillator signal.

18 Claims, 3 Drawing Sheets

US 8,121,215 B2

BROADBAND SELF ADJUSTING QUADRATURE SIGNAL GENERATOR AND METHOD THEREOF

TECHNICAL FIELD OF THE DISCLOSURE

The present disclosure relates generally to a quadrature signal generator, and more specifically to a broadband self adjusting quadrature signal generator.

BACKGROUND OF THE DISCLOSURE

Quadrature signals are common in communication systems and chips for use in communication systems. In particular, there are many needs for a quadrature signal generator that operates over a wide range of frequencies, including the need for a local oscillator (LO) signal in digital transmitters for multi-mode, multi-band communication devices, such as cellular telephones or radios. As complexity rises and performance demands increase, signal-to-noise and power issues often result. Generation of quadrature signals with desired signal-to-noise ratios has proven difficult.

Communications signals are often implanted on a carrier signal and modulated. Numerous modulated carrier signals may be simultaneously transmitted as long as the signals are transmitted upon differing radio frequency channels of the electromagnetic frequency spectrum. Regulatory bodies have divided portions of the electromagnetic frequency spectrum into frequency bands and have regulated transmission of the modulated carrier signals upon various ones of the frequency bands. It should be noted that frequency bands are further divided into channels, and such channels form the radio-frequency channels of a radio communication system.

Quadrature amplitude modulation (QAM) is a modulation technique which may be advantageously utilized to transmit efficiently a communication signal encoded into discrete form. More particularly, one particular QAM modulation technique is a Π/4-differential quadrature phase shift keying (or Π/4-DQPSK) modulation technique. Such modulation technique has been selected as a modulation standard for several cellular communication systems. In a Π/4-DQPSK modulation technique, the binary data stream into which the communication signal is encoded is separated into bit pairs. Such bit pairs are utilized to cause phase shifts of a carrier wave in increments of plus or minus Π/4 radians or plus or minus 3 Π/4 radians according to the values of individual bit pairs of the encoded signal. Such phase shifts are effectuated by applying the binary data stream comprised of the bit pairs to a pair of mixer circuits. A sine component of a carrier signal is applied to an input of a first mixer circuit of the pair of mixer circuits, and a cosine component of the carrier signal is applied to an input of a second mixer circuit of the pair of mixer circuits. It should be noted that the sine and cosine components of the carrier signal are in a relative phase relationship of ninety degrees with one another. A quadrature signal generator is utilized to apply the sine and cosine components of the carrier signal to the first and second mixer circuits of the pair of mixer circuits, respectively.

A quadrature signal generator may be formed of a resistor-capacitor pair in which the value of at least either the resistor or the capacitor is variable as a function of voltage. The relative phase of the signals generated by a quadrature signal generator are dependent upon the values of the resistor-capacitor pair, and, as the values of the resistor and capacitor of the resistor-capacitor pair are functions of voltage, the range of frequencies over which quadrature can be generated by the quadrature signal generator is dependent upon voltage levels of phase-controlling voltages applied to the quadrature signal generator.

As the circuitry of apparatus, such as a radiotelephone utilized in a cellular, communication system, of which the quadrature signal generators form a portion, are constructed to be operated at ever-lower voltage levels, the range of values of which the resistor or capacitor of the resistor-capacitor pair can take is increasingly limited. The range of frequencies of signals generated by a quadrature signal generator so constructed is increasingly limited.

A quadrature signal generator may alternately be constructed of a flip-flop pair arranged such that the outputs of each flip-flop of the flip-flop pair are applied to inputs of the other flip-flop of the flip-flop pair. A clock signal is also applied to each of the flip-flops of the flip-flop pair wherein the clock signal is inverted prior to application to one of the flip-flops. Outputs of the respective flip-flops of the flip-flop pair are in a ninety degree phase relationship (and, hence, are in phase quadrature) when the duty cycle of the clock signal applied to the flip-flops is of a fifty percent (50%) duty cycle. That is, the clock signal must be of a high logic level for exactly half of the period of the clock signal and be of a low logic level for exactly half of the period of the clock signal.

Any variation in the duty cycle of the clock signal causes the signal output by the respective ones of the flip-flop pair to be out-of-phase quadrature (i.e., in a phase relationship other than a ninety degree phase relationship) with one another. When the duty cycle of the clock signal is significantly different than a fifty percent (50%) duty cycle, the signals generated by the flip-flop pair are significantly out-of-phase quadrature.

Clock oscillators which generate clock signals will not in general produce clock signals exactly of the fifty percent (50%) duty cycle. Additionally, the duty cycle of the clock signal generated by a clock oscillator may vary as the clock oscillator ages or as a result of circuit placement of the clock oscillator.

Prior art attempts to generate quadrature signals have included the use of frequency doublers, but such signal processing generally results in an output half the signal strength of the input. This result may be acceptable, in certain applications, but adverse effects on signal-to-noise performance can render this approach problematic.

DETAILED DESCRIPTION OF THE DISCLOSURE

The disclosure provides an apparatus and method for generating a pair of low noise phase quadrature signals. The apparatus and method adjust the phase of a clock signal in a phase shifting amplifier to generate an output signal to use as an input to an exclusive-or ("XOR") circuit. The XOR circuit XORs the output signal from the amplifier with the clock signal and outputs a signal with double the input frequency and with an increased output signal level (i.e., increased amplitude, hereinafter referred to as the frequency doubled signal. The frequency doubled signal is fed into a divide-by-two circuit, producing two signals that are desired to be ninety degrees out-of-phase with each other. These two signals are used in a radio transceiver for communication over a communication network as well known to a person of ordinary skill in the art. In addition, these two signals are fed into a phase detector to detect the actual phase relationship of the two signals. Based on the actual phase relationship of the two signals, the phase detector generates a feedback signal to be used as a second input into the amplifier to control the phase of the output signal from the amplifier that is ultimately used as one of the inputs into the XOR circuit. The phase detector, thus, serves to reduce the output level of the feedback signal as the two output signals from the divide by-two-circuit drift from being ninety degrees out-of-phase. In other embodiments, optional circuitry can be added to the quadrature signal generator. For example, the feedback signal generated by the phase detector can be buffered and/or filtered, before being fed back into the amplifier. Alternatively or additionally, the clock signal being fed into the XOR circuit can be adjusted by a first duty cycle adjustor for an increased signal and optimum duty cycle (e.g., 50% duty cycle) from the XOR circuit. Alternatively or additionally, a second duty cycle adjustment can be made prior to the divide-by-two circuit to target the optimum duty cycle for a desired performance level. Let us now refer to the figures and describe the present disclosure in greater detail.

Figure 1:
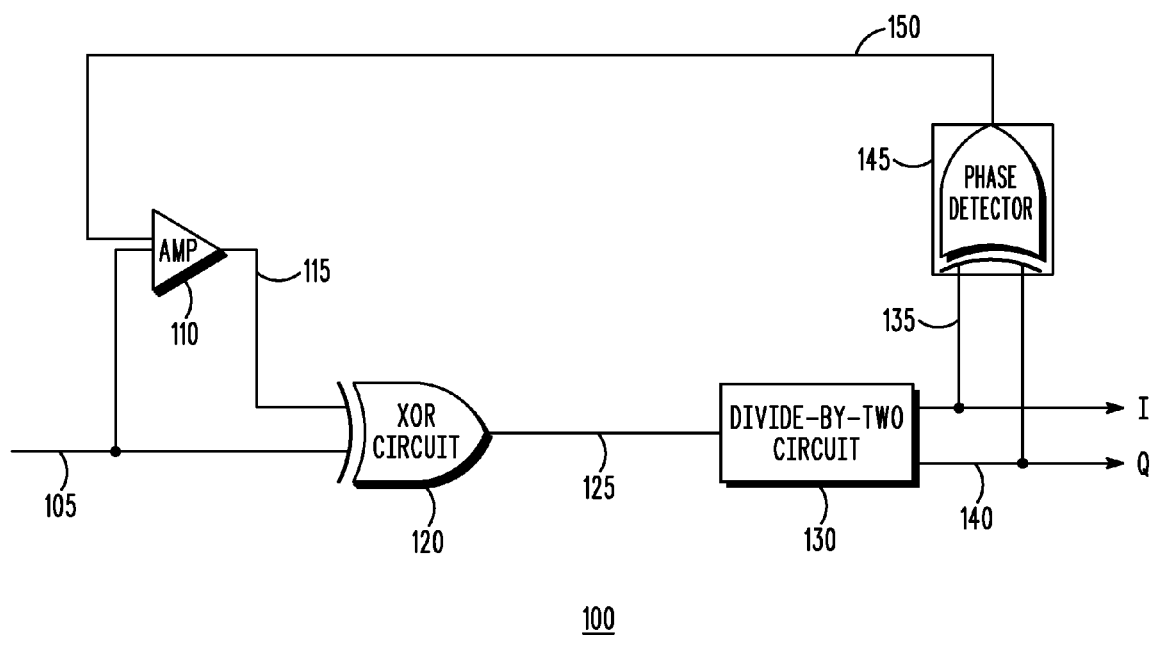
FIG. 1 illustrates a schematic diagram of a quadrature signal generator in accordance with a first embodiment of the disclosure.
Figure 2:
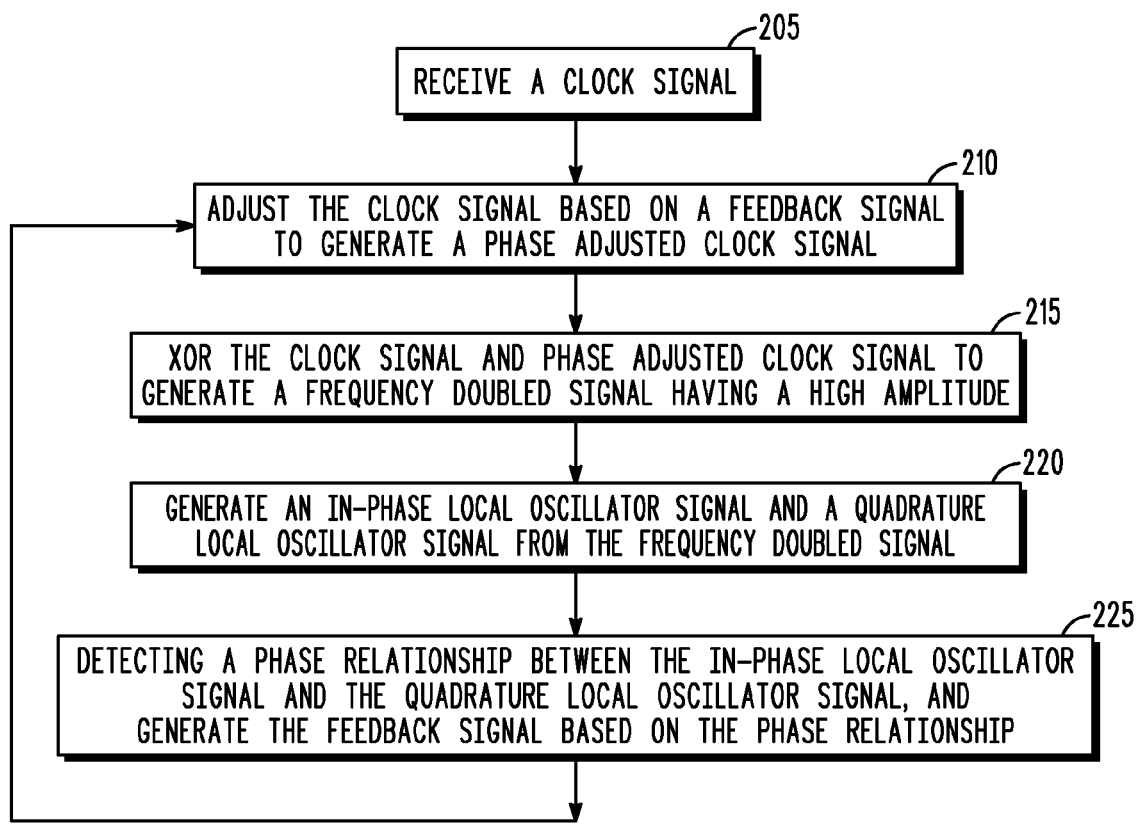
FIG. 2 is a flowchart of an example for generating a quadrature signal in accordance with the first embodiment of the disclosure.

FIGS. 1 and 2 illustrate a schematic diagram of a quadrature signal generator 100 and its corresponding flow diagram in accordance with a first embodiment of the disclosure. A clock signal 105 is received (step 205) by the quadrature signal generator 100 and is used as an input to a phase shifting amplifier 110. A feedback signal 150 is also used as an input to the amplifier 110. The origin and generation of the feedback signal 150 will be discussed in further detail below, however, the amplifier 110 may use a default signal as an input until the feedback signal 150 is generated (step 210). In general, the amplifier adjusts the phase of the clock signal 105 in response to the feedback signal 150 to generate a phase adjusted clock signal 115.

Once the phase adjusted clock signal 115 is generated by the amplifier 110, the clock signal 105 and the phase adjusted clock signal 115 are used as inputs for a XOR circuit 120. In this embodiment, the XOR circuit 120 is used as a frequency doubler (hereinafter referred to as the XOR frequency doubler) that doubles the frequency of the clock signal 105. The XOR frequency doubler 120 receives the clock signal 105 and the phase adjusted clock signal 115 and generates a frequency doubled signal 125 having a high amplitude (step 215). The frequency doubled signal 125 is used as an input to a divide-by-two circuit 130. The divide-by-two circuit 130 uses the frequency doubled signal 125 to generate two signals: an in-phase local oscillator signal 135 and a quadrature local oscillator signal 140 (step 220). In one embodiment, the amplitude of the clock signal 105 is substantially equal to the amplitudes of the in-phase local oscillator signal and the quadrature local oscillator signal. It is desired that the in-phase local oscillator signal 135 and the quadrature local oscillator signal 140 are substantially ninety degrees out-of-phase with each other. In other words, the in-phase local oscillator signal 135 and quadrature local oscillator signal 140 are substantially in-phase quadrature. Once generated, these two signals become the output of the quadrature signal generator 100 and are used in a radio transceiver for communication over a communication network as well known to a person of ordinary skill in the art.

In order to dynamically optimize the output of the quadrature signal generator 100, the quadrature signal generator 100 continuously self-adjusts to generate the in-phase local oscillator signal 135 and the quadrature local oscillator signal 140 such that they are as close to ninety degree out-of-phase with each other as possible. As such, the present disclosure also routes the in-phase local oscillator signal 135 and the quadrature local oscillator signal 140 back through the quadrature signal generator 100 and uses the signals as inputs into a phase detector 145 within the quadrature signal generator 100.

The phase detector 145 detects the phase relationship between the in-phase local oscillator signal 135 and the quadrature local oscillator signal 140. Based on the phase relationship between the in-phase local oscillator signal 135 and the quadrature local oscillator signal 140, the phase detector 145 generates a feedback signal 150 (step 225). Thus, the feedback signal 150 is reflective of the phase relationship of the in-phase local oscillator signal 135 and the quadrature local oscillator signal 140. The feedback signal 150 is used to adjust the phase of amplifier 110 such that the in-phase local oscillator signal 135 and the quadrature local oscillator signal 140 are substantially ninety degrees out-of-phase with each other. It should be noted that there are numerous types of circuits or software implementations that could be used as the phase detector 145 to detect the phase of signals 135 and 140 and create the feedback signal 150, producing the same results. For example, the phase detector 145 can be an exclusive-or circuit such that the feedback signal 150 is maximized when the in-phase local oscillator signal 135 and the quadrature local oscillator signal 140 are in-quadrature (i.e., the in-phase local oscillator signal 135 and the quadrature local oscillator signal 140 are out-of-phase with each other by substantially ninety degrees), and the amplitude of the feedback signal 150 decreases as the relative phase between the in-phase local oscillator signal 135 and the quadrature local oscillator signal 140 drifts away from ninety degrees.

As mentioned briefly above, the feedback signal 150 is used as one of the inputs to the amplifier 110 to control the phase adjustment of the clock signal 105 in the amplifier 110 when producing the phase adjusted clock signal 115, thus creating the feedback loop within the quadrature signal generator 100. The amplifier 110 adjusts the clock signal 105 in response to the feedback signal 150 to generate the phase adjusted clock signal 115. The phase adjusted clock signal 115 is used as an input to the XOR frequency doubler 120 along with the clock signal 105, and the flow repeats itself as described above.

Figure 3:
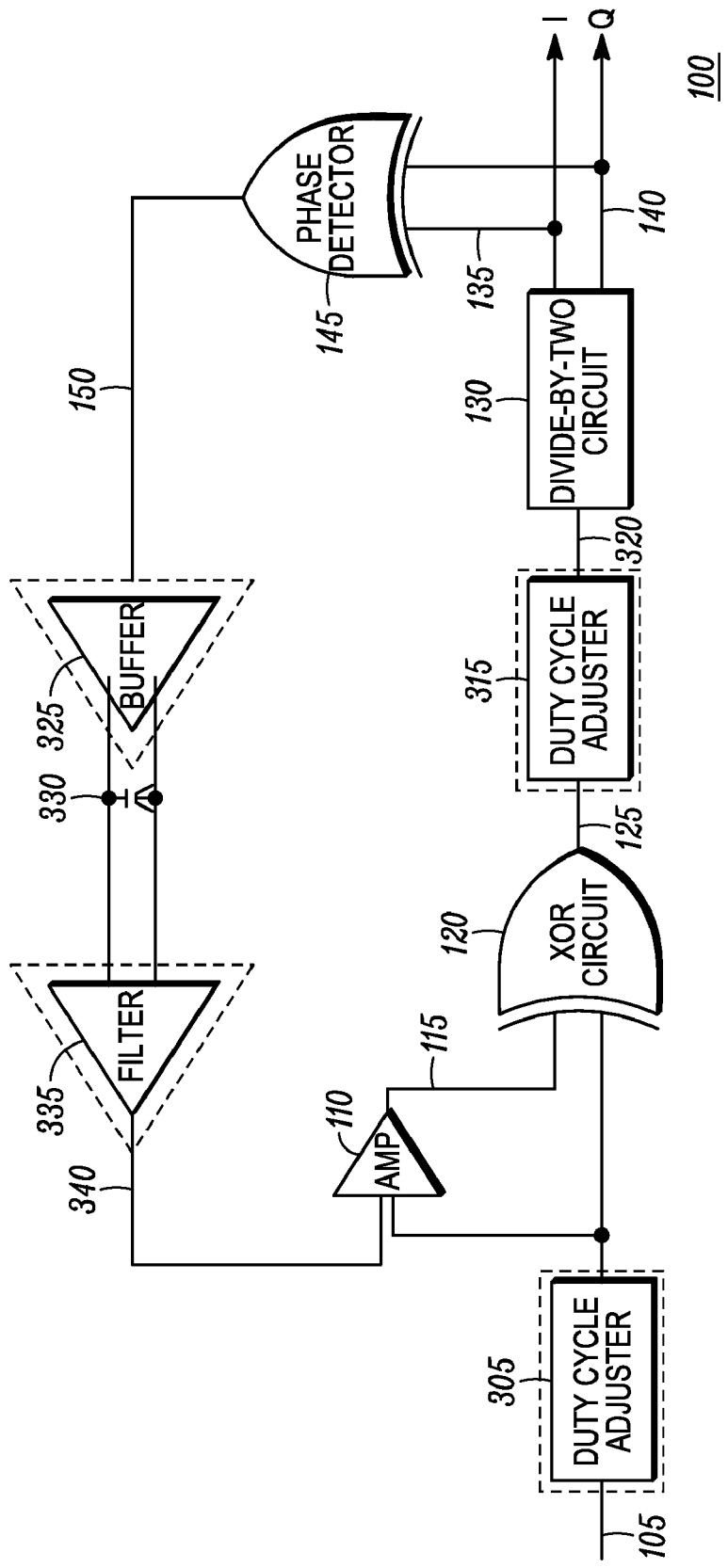
FIG. 3 illustrates a schematic diagram of the quadrature signal generator in accordance with other embodiments of the disclosure.

In alternative embodiments, the quadrature signal generator 100 may comprise any number of optional components. For ease of explanation, FIG. 3 depicts a block diagram of the quadrature signal generator having a plurality of optional components in accordance with at least a second embodiment of the present disclosure. It will be appreciated by those persons of ordinary skill in the art that any of these optional components, and other not mentioned, may be added to the quadrature signal generator either singularly or in any combination, and still remain within the spirit and scope of the present invention. In FIG. 3, the quadrature signal generator 100 may comprise a first duty cycle adjustor 305. In this embodiment, when the first duty cycle adjustor 305 is present, the clock signal 105 is adjusted by the duty cycle adjustor 305 to generate a duty cycle adjusted clock signal 310 having a regulated 50% duty cycle, and the duty cycle adjusted clock signal 310 is fed into the amplifier 110 and the XOR frequency detector 120 as inputs, as opposed to the clock signal 105, as described above with respect to FIG. 1.

FIG. 3 also depicts an optional second duty cycle adjustor 315. Before the frequency doubled signal 125 enters the divide-by-two circuit 130, the frequency doubled signal 125 may be processed by the second duty cycle adjustor 315 to generate an adjusted frequency doubled signal 320 having a 50% duty cycle prior to entering the divide-by-two circuit 130. Thus, in this embodiment when the second duty cycle adjustor 315 is present, the adjusted frequency doubled signal 320 is fed into the divide-by-two circuit 130, as opposed to the frequency doubled signal 125, as described above with respect to FIG. 1.

The quadrature signal generator 100 may also depict at least one optional buffer and/or filter. In FIG. 3, a buffer 325 and a filter 335 are depicted for exemplary purposes only. In one embodiment, when the XOR detector 145 generates the feedback signal 150, buffer 325 buffers the feedback signal 150 to provide a buffer for the capacitor 330 in order to control the impedance at 330. The buffer 325 is sized to provide a predetermined time lag in the buffered signal. The capacitor 330 may be positioned between the buffer 325 and the filter 335 to assist in filtering the buffered signal. The buffered signal is then passed to the filter 335 to generate the filtered feedback signal 340 to be used as the input to the amplifier 110, as opposed to the feedback signal 150, as described above with respect to FIG. 1. In view of this disclosure, persons of ordinary skill in the art will readily understand that additional buffers, filters, and or capacitors may be utilized depending on the characteristics and stability of the quadrature signal generator 100. For example, if a second buffer is placed between the first buffer 325 and the filter 335, a capacitor can be placed between the first buffer 325 and the second buffer, between the second buffer and the filter 335, or a first capacitor between the first buffer 325 and the second buffer and a second capacitor between the second buffer and the filter 335.

It is important to note that the figures and description illustrate specific applications and embodiments of the present disclosure, and is not intended to limit the scope of the present disclosure or claims to that which is presented therein. For example, the logic gates, including the XORs, can be formed of different logic gates that provide logically equivalent results. Additionally, the techniques disclosed herein can be cascaded, by for example using multiple XOR frequency doublers and multiple divide-by-two circuits in series, and such a technique is within the disclosure herein. Moreover, while the above disclosure describes a hardware implementation of a quadrature signal generator, a person of ordinary skill in the art will readily understand that the present disclosure could also be implemented in software (e.g., a digital signal processor), or a combination thereof.

Upon reading the specification and reviewing the drawings hereof, it will become immediately obvious to those skilled in the art that a myriad of other embodiments of the present disclosure are possible, and that such embodiments are contemplated and fall within the scope of the presently claimed disclosure. Various changes and modifications can be made without departing from the spirit and scope of the disclosure. The scope of the disclosure is indicated in the appended claims, and all changes that come within the meaning and range of equivalents are intended to be embraced therein.

I claim:

1. A method of generating phase quadrature signals, the method comprising:
receiving a clock signal;
adjusting the clock signal in response to a feedback signal to generate a phase adjusted clock signal;
exclusive-oring the clock signal and the phase adjusted clock signal to generate a frequency doubled signal;
generating an in-phase local oscillator signal and a quadrature local oscillator signal from the frequency doubled signal, wherein the in-phase local oscillator signal and the quadrature local oscillator signal are out-of-phase with each other;
detecting a phase relationship between the in-phase local oscillator signal and the quadrature local oscillator signal; and
generating the feedback signal based on the phase relationship between the in-phase local oscillator signal and the quadrature local oscillator signal.

2. The method of claim 1 wherein an amplitude of the in-phase local oscillator signal and an amplitude of the quadrature local oscillator signal are equal to an amplitude of the clock signal.

3. The method of claim 1 wherein the in-phase local oscillator signal and the quadrature local oscillator signal are sent to a radio transceiver that is capable of being in communication with a communication network.

4. The method of claim 1 further comprising adjusting the clock signal to a fifty percent duty cycle prior to exclusive-oring the clock signal and the phase adjusted clock signal to generate the frequency doubled signal.

5. The method of claim 1 further comprising adjusting the frequency doubled signal to a fifty percent duty cycle prior to generating the in-phase local oscillator signal and the quadrature local oscillator signal.

6. The method of claim 1 further comprising buffering the feedback signal prior to adjusting the clock signal.

7. The method of claim 1 further comprising filtering the feedback signal prior to adjusting the clock signal.

8. The method of claim 1 further comprising buffering and filtering the feedback signal prior to adjusting the clock signal.

9. The method of claim 1 wherein the step of detecting the phase relationship between the in-phase local oscillator signal and the quadrature local oscillator signal comprises exclusive-oring the in-phase local oscillator signal and the quadrature local oscillator signal.

10. A quadrature signal generator comprising:
an amplifier having a clock signal as a first input and a feedback signal as a second input to generate a phase adjusted clock signal;
an exclusive-or circuit having the phase adjusted clock signal as a first input and the clock signal as a second input to generate a frequency doubled signal;
a divide-by-two circuit in series with the exclusive-or circuit, having the frequency doubled signal as an input to generate an in-phase local oscillator signal and a quadrature local oscillator signal; and
a phase detector in series with the divide-by-two circuit, having the in-phase local oscillator signal as a first input and the quadrature local oscillator signal as a second input to generate the feedback signal that is based on a phase relationship between the in-phase local oscillator signal and the quadrature local oscillator signal, wherein the phase detector is between the amplifier and the divide-by-two circuit, and wherein the divide-by-two circuit is between the exclusive-or circuit and the phase detector.

11. The quadrature signal generator of claim 10 wherein the phase detector is a second exclusive-or circuit.

12. The quadrature signal generator of claim 10 wherein an amplitude of the in-phase local oscillator signal and an amplitude of the quadrature local oscillator signal are equal to an amplitude of the clock signal.

13. The quadrature signal generator of claim 10 further comprising a duty cycle adjustor in series with the exclusive-or circuit, and wherein the duty cycle adjustor adjusts a duty cycle of the clock signal to fifty percent prior to the clock signal being used as the first input for the amplifier and the second input for the exclusive-or circuit.

14. The quadrature signal generator of claim 10 further comprising a duty cycle adjustor in series with the divide-by-two circuit, and wherein the duty cycle adjustor is located between the exclusive-or circuit and the divide-by-two circuit, and wherein the duty cycle adjustor adjusts a duty cycle of the frequency doubled signal to fifty percent prior to the frequency doubled signal being used as the input for the divide-by-two-circuit.

15. The quadrature signal generator of claim 10 further comprising at least one buffer in series with the phase detector and the amplifier, and wherein the at least one buffer is located between the phase detector and the amplifier, and wherein the at least one buffer buffers the feedback signal prior to the feedback signal being used as the second input to the amplifier.

16. The quadrature signal generator of claim 15 wherein the at least one buffer is sized to provide a predetermined time lag in the feedback signal.

17. The quadrature signal generator of claim 10 further comprising at least one filter in series with the phase detector and the amplifier, and wherein the at least one filter is located between the phase detector and the amplifier, and wherein the at least one filter filters the feedback signal prior to the feedback signal being used as the second input to the amplifier.

18. A quadrature signal generator comprising:
    means for receiving a clock signal;
    means for adjusting the clock signal in response to a feedback signal to generate a phase adjusted clock signal;
    means for exclusive-oring the clock signal and the phase adjusted clock signal to generate a frequency doubled signal;
    means for generating an in-phase local oscillator signal and a quadrature local oscillator signal from the frequency doubled signal;
    means for detecting a phase relationship between the in-phase local oscillator signal and the quadrature local oscillator signal; and
means for generating the feedback signal based on the phase relationship between the in-phase local oscillator signal and the quadrature local oscillator signal.

* * * * *

UNITED STATES PATENT AND TRADEMARK OFFICE
CERTIFICATE OF CORRECTION

PATENT NO. : 8,121,215 B2
APPLICATION NO. : 11/771005
DATED : February 21, 2012
INVENTOR(S) : Wilhite Page 1 of 1

It is certified that error appears in the above-identified patent and that said Letters Patent is hereby corrected as shown below:

In Column 7, Line 25, in Claim 14, delete "divide-by-two-circuit." and insert
-- divide-by-two circuit. --, therefor.

Signed and Sealed this
Eighteenth Day of December, 2012

David J. Kappos
*Director of the United States Patent and Trademark Office*